United States Patent
Cook

(10) Patent No.: US 8,559,584 B2
(45) Date of Patent: Oct. 15, 2013

(54) NUCLEAR REACTOR AUTOMATIC DEPRESSURIZATION SYSTEM

(75) Inventor: Bruce M. Cook, Pittsburgh, PA (US)

(73) Assignee: Westinghouse Electric Company LLC, Cranberry Township, PA (US)

(*) Notice: Subject to any disclaimer, the term of this patent is extended or adjusted under 35 U.S.C. 154(b) by 470 days.

(21) Appl. No.: 12/972,568

(22) Filed: Dec. 20, 2010

(65) Prior Publication Data

US 2012/0155597 A1    Jun. 21, 2012

(51) Int. Cl.
*G21C 9/004* (2006.01)
*G21C 9/00* (2006.01)
*G21C 15/18* (2006.01)

(52) U.S. Cl.
USPC ............ 376/283; 376/245; 376/277; 376/282

(58) Field of Classification Search
USPC ......... 376/277, 283, 284, 282, 307, 463, 245, 376/298, 299
See application file for complete search history.

(56) References Cited

U.S. PATENT DOCUMENTS

| | | | | |
|---|---|---|---|---|
| 4,664,877 A * | 5/1987 | Magee et al. | ................. | 376/283 |
| 4,753,771 A * | 6/1988 | Conway et al. | ............... | 376/283 |
| 5,028,383 A * | 7/1991 | Moore | .......................... | 376/277 |
| 5,106,571 A * | 4/1992 | Wade et al. | .................... | 376/283 |
| 5,154,876 A * | 10/1992 | Ehrke et al. | .................... | 376/283 |
| 5,259,008 A * | 11/1993 | Schulz | .......................... | 376/283 |
| 5,268,943 A | 12/1993 | Corletti et al. | | |
| 5,282,230 A * | 1/1994 | Billig et al. | .................... | 376/283 |
| 5,295,168 A * | 3/1994 | Gluntz et al. | ................. | 376/283 |
| 5,309,488 A * | 5/1994 | Matsuoka | ....................... | 376/282 |
| 5,345,481 A * | 9/1994 | Oosterkamp | ................. | 376/283 |
| 5,353,318 A * | 10/1994 | Gluntz | .......................... | 376/283 |
| 5,426,681 A * | 6/1995 | Aburomia | ...................... | 376/283 |
| 5,491,731 A * | 2/1996 | Corpora et al. | ............... | 376/307 |
| 5,661,769 A * | 8/1997 | Mansani et al. | ............. | 376/283 |
| 5,943,384 A | 8/1999 | Mansani et al. | | |

* cited by examiner

*Primary Examiner* — Bernarr Gregory
(74) *Attorney, Agent, or Firm* — Joseph C. Spadacene; Westinghouse Electric Company LLC

(57) ABSTRACT

A blocking device for preventing the actuation of an automatic depressurization system in a pressurized nuclear reactor system due to spurious signals resulting from a software failure. The blocking signal is removed when the coolant level within the core makeup tanks drop below a predetermined level.

7 Claims, 5 Drawing Sheets

NUCLEAR REACTOR AUTOMATIC DEPRESSURIZATION SYSTEM

BACKGROUND OF THE INVENTION

1. Field of the Invention

This invention relates in general to pressurized water nuclear reactors and, in particular, to systems for injecting additional coolant into the reactor coolant circuit in the event of a postulated accident. The invention is applicable to reactor systems having passive safety features with automatic depressurization of the reactor coolant circuit to facilitate the injection of additional coolant water.

2. Related Art

A nuclear reactor, such as a pressurized water reactor, circulates coolant at high pressure through a coolant circuit traversing a reactor pressure vessel containing nuclear fuel for heating the coolant and a steam generator operable to extract energy from the coolant for useful work. A residual heat removal system is typically provided to remove decay heat from the pressure vessel during shutdown. In the event of a loss of coolant, means are provided for adding additional coolant. A coolant loss may involve only a small quantity, whereby additional coolant can be injected from a relative small high pressure make-up water supply, without depressurizing the reactor coolant circuit. If a major loss of coolant occurs, it is necessary to add coolant from a low pressure supply containing a large quantity of water. Since it is difficult using pumps to overcome the substantial pressure of the reactor coolant circuit, e.g., 2,250 psi or 150 bar, the reactor coolant circuit is depressurized in the event of a major loss of coolant so that coolant water can be added from an in-containment refueling water storage tank at the ambient pressure within the nuclear reactor system containment shell.

The primary circuit of an AP1000 nuclear reactor system, offered by the Westinghouse Electric Company LLC, of which the present invention is a part, uses a staged pressure reduction system for depressurizing the primary coolant circuit, which is illustrated in FIGS. 1 and 2. A series of valves 72 couple the reactor outlet 56 (also known as the "hot leg" of the primary coolant circuit) to the inside of the containment shell 54. When initially commencing the pressurization, the coolant circuit 46 and the containment structure 54 are coupled by the depressurization valve 72 through one or more small conduits 76 along a flow path with not insubstantial back pressure. As the pressure in the coolant circuit drops, additional conduits are opened by further depressurization valves 72 in stages, each stage opening a larger and/or more direct flow path between the coolant circuit 46 and the containment shell 54.

The initial depressurization stages couple a pressurizer tank 80 which is connected by conduits to the coolant circuit hot leg 56, to spargers 74 in an in-containment refueling water supply tank 50. The spargers 74 comprise conduits leading to small jet orifices submerged in the tank, thus providing back pressure and allowing water to condense from steam emitted by the spargers into the tank 50. The successive depressurization stages have progressively larger conduit inner diameters. A final stage has a large conduit 84 that couples the hot leg directly into the containment shell 54, for example, at a main coolant loop compartment 40 through which the hot leg 56 of the reactor circuit 46 passes. This arrangement reduces the pressure in the coolant circuit expeditiously, substantially to atmospheric pressure, without sudden hydraulic loading of the respective reactor conduits. When the pressure is sufficiently low, water is added to the coolant circuit by gravity flow from the in-containment refueling water supply tank 50.

Automatic depressurization in the AP1000 reactor system is a passive safeguard which ensures that the reactor core is cooled even in the case of a major loss of coolant accident such as a large breach in the reactor coolant circuit. Inasmuch as the in-containment refueling water storage tank drains by gravity, no pumps are required. Draining the water into the bottom of the containment building where the reactor vessel is located, develops a fluid pressure head of water in the containment sufficient to force water into the depressurized coolant circuit without relying on active elements such as pumps. Once the coolant circuit is at atmospheric pressure and the containment is flooded, water continues to be forced into the reactor vessel, where the boiling of the water cools the nuclear fuel. Water in the form of steam escaping from the reactor coolant circuit is condensed on the inside walls of the containment shell, and drained back to be injected again into the reactor coolant circuit.

The foregoing arrangement has been shown to be effective in the scenario of a severe loss of coolant accident. However, there is a potential that if the automatic depressurization system is activated in less dire circumstances, the containment may be flooded needlessly. Depressurization followed by flooding of the reactor containment requires shut down of the reactor and a significant cleanup effort. This concern has been partially addressed in U.S. Pat. No. 5,268,943, assigned to the Assignee of this invention.

It has been postulated that a spurious actuation of the AP1000 automatic depressurization system under normal conditions could lead to an accident that is more severe than has been analyzed for the plant. Accordingly, a further improvement in the automatic depressurization is desired to guard against such an occurrence.

Therefore, it is an object of this invention to provide a device that blocks actuation of the automatic depressurization system valves under normal plant conditions.

It is further object of this invention to provide such a device that will maintain a blocking signal on the inputs of the depressurization system when the core makeup tanks are full, to reduce the initiating event frequency of spurious automatic depressurization system actuation. In true accident scenarios, the core makeup tanks are drained in the early stages of the mitigation. Therefore, low level in either of these tanks will provide an indication that the blocking signal needs to be removed to allow the safety system to actuate the automatic depressurization system valves as designed.

Further, it is an object of this invention to provide such a system that is substantially fail safe to assure that it does not impede the actuation of the automatic depressurization system when it is needed.

SUMMARY OF THE INVENTION

To achieve the foregoing objectives, this invention provides a nuclear reactor system having a pressurized coolant circuit including a pressure vessel, heat exchanger, core makeup tank and connecting piping, with the connecting piping including a main coolant loop piping connecting the heat exchanger to the pressure vessel in a closed loop configuration and a makeup water connection connecting the core makeup tank to the pressure vessel. The nuclear reactor system is housed within a containment shell that also has an in-containment water reservoir that is maintained vented to an atmosphere of the containment shell. The nuclear reactor system further includes a depressurization system for automatically depressurizing the pressurized coolant circuit in the event of a design basis accident and connecting the water reservoir to the pressure vessel. A blocking device is connected to the depressurization system for preventing the depressurization system from activating when coolant within the core makeup tank is above a preselected level. Preferably, the blocking device fails in a failsafe condition wherein the failure of substantially any component within the blocking device will stop the blocking device from preventing the depressurization system from activating. Desirably, the preselected level is a level at which the core makeup tank is considered substantially full.

In one embodiment, the core makeup tank includes more than one water tank connected to the pressure vessel and wherein the blocking device prevents the depressurization system from activating when coolant in each of the water tanks is above the preselected level. Preferably, the blocking device does not prevent the depressurization system from activating when coolant within any of the water tanks is below the preselected level.

BRIEF DESCRIPTION OF THE DRAWINGS

A further understanding of the invention can be gained from the following description of the preferred embodiments when read in conjunction with the accompanying drawings in which.

DESCRIPTION OF THE PREFERRED EMBODIMENT

Figure 1:
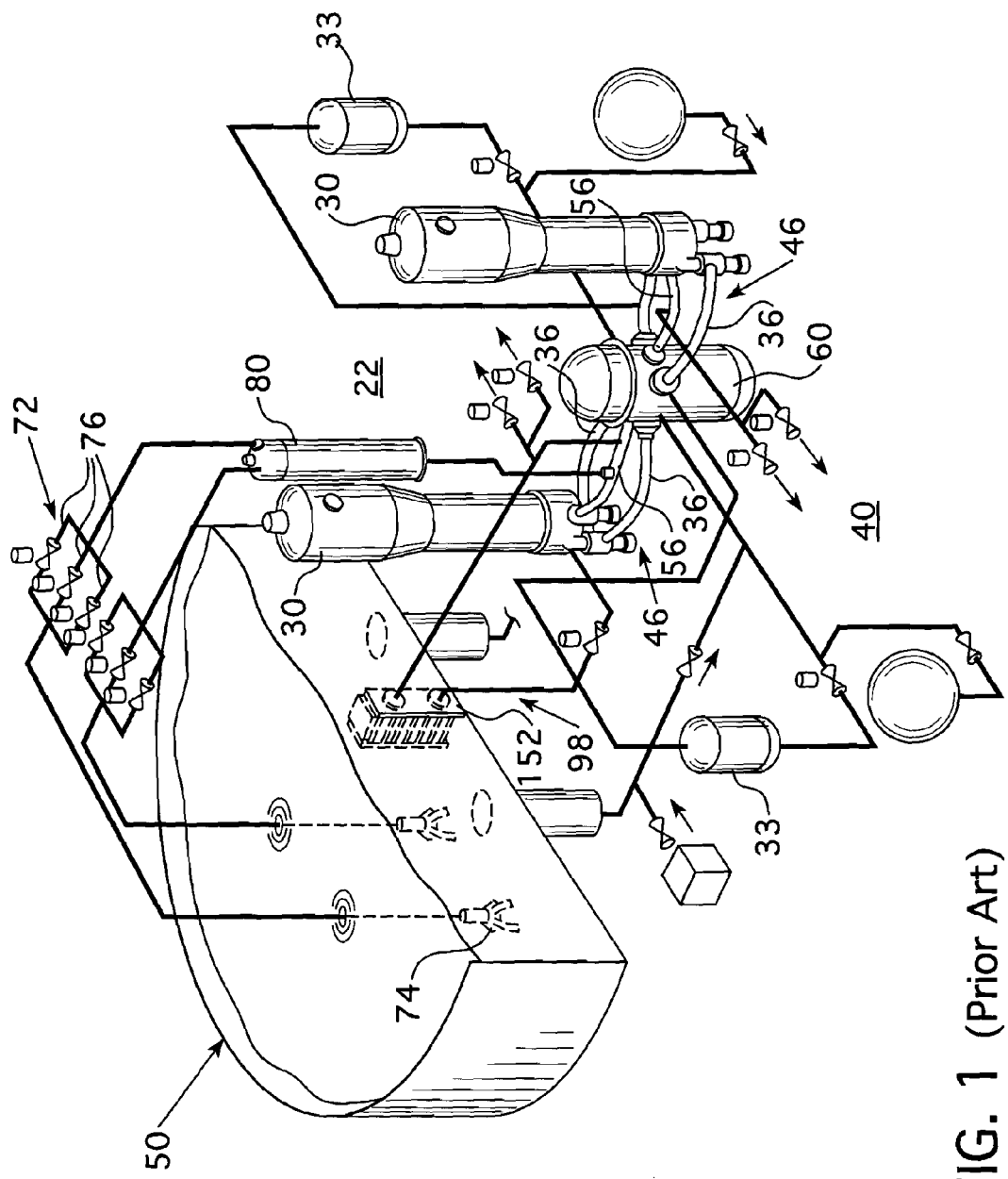
FIG. 1 is an isometric view of the components of a passive core cooling system which can benefit from this invention.
Figure 2:
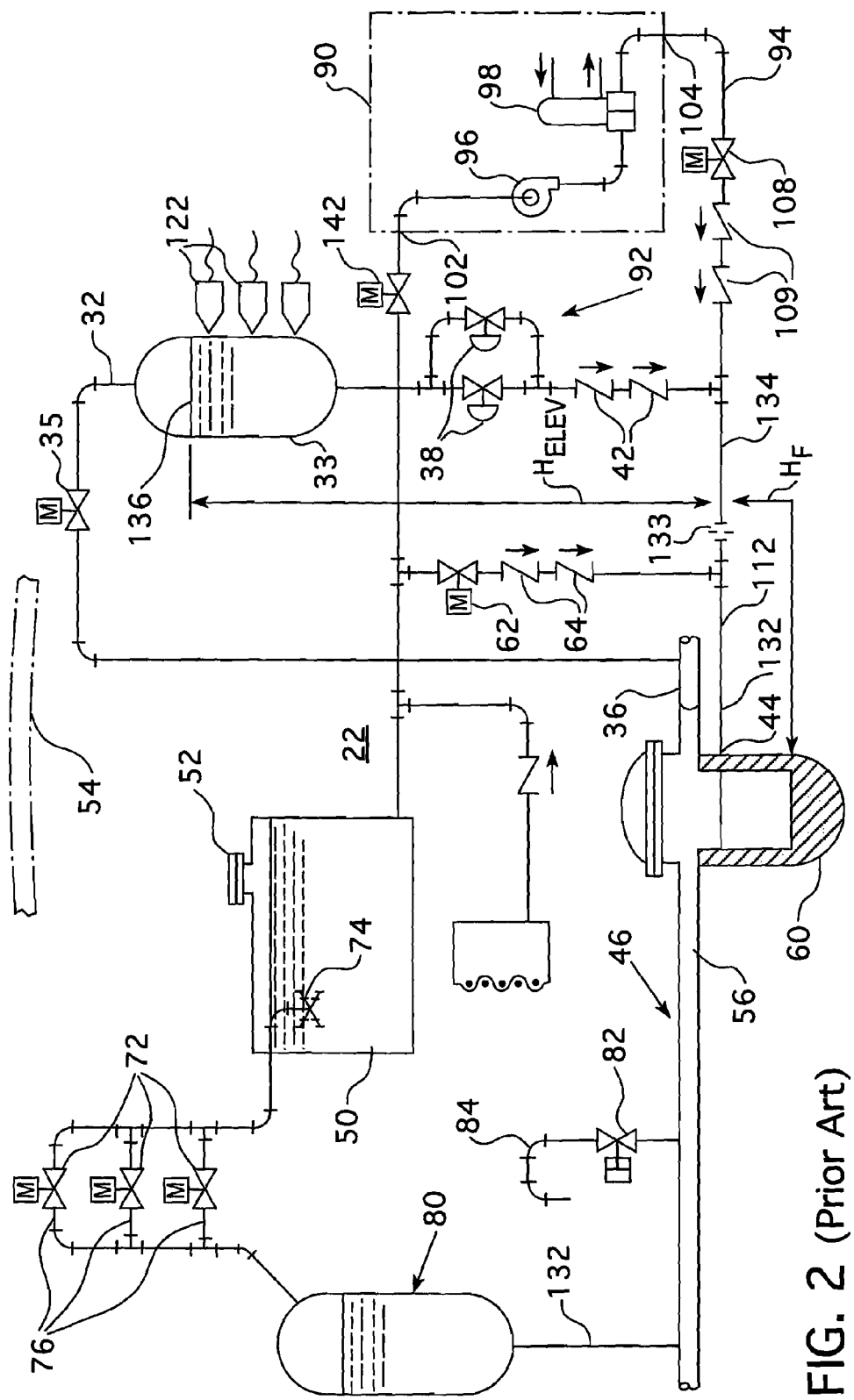
FIG. 2 is a schematic system layout of the passive core cooling system of FIG. 1.

From FIG. 2, it can be appreciated that there are two sources of coolant to make up for loss of the coolant in the AP1000 nuclear reactor system 22. An inlet 32 of the high pressure core makeup tank 33 is coupled by valves 35 to the reactor coolant inlet or "cold leg" 36. The high pressure core makeup tank 33 is also coupled by motorized valves 38 and check valves 42 to a reactor vessel injection inlet 44. The high pressure core makeup tank 33 is operable to supply additional coolant to the reactor coolant circuit 46, at the operational pressure of the reactor, to make up for relatively small losses. However, the high pressure core makeup tank 33 contains only a limited supply of coolant, though, as can be appreciated from FIG. 1, there are two core makeup tanks in the system.

A much larger quantity of coolant water is available from the in-containment refueling water storage tank 50, at atmospheric pressure due to vent 52, which opens from the tank 50 into the interior of the containment building 54. When the reactor system 22 is operating, the coolant circuit operational pressure is on the order 2,250 psi (150 bar). Therefore, in order to add coolant to the reactor vessel 60 and the coolant circuit 46 coupled thereto, the system must be depressurized, i.e., brought down to atmospheric or nearly atmospheric pressure in the containment. The automatic depressurization system depressurizes the coolant circuit 46 in stages, to limit the thermal and hydraulic loading on the main coolant pipes 36, 56 and the reactor vessel, due to depressurization, by venting into the containment 54.

The nuclear reactor system 22 in the example shown in FIGS. 1 and 2, is depressurized by venting the cooling circuit 46 into the containment 54 in four stages of decreasing pressure, the last stage characterized by direct coupling of the cooling circuit 46 to the interior of the environment of the containment 54. In the last stage, coolant from the refueling water storage tank 50 can be fed by gravity through motorized valve 62 and check valve 64 into the reactor vessel injection inlet 44. Additionally, in the last stage, the containment building 54 can be flooded with water from the refueling water storage tank 50. Water in the containment 54 thus drains by gravity into the coolant circuit 46 and is boiled by the nuclear fuel. Steam thereby generated is vented into the containment 54, where the steam condenses on the relatively cooler containment walls as explained in co-pending application Ser. No. 13,444,932, filed Apr. 12, 2012. The condensed water drains back into the bottom of the containment 54, and is recycled; the system thus described providing a passive cooling means independent of pumps and other actively powered circulation components.

During the staged depressurization represented by the schematic shown in FIG. 2, three initial stages are achieved successively by opening the initial stage depressurization valves 72 coupled via spargers 74 between the cooling circuit 46 and the containment shell 54. The respective valves 72 in each depressurization leg 76 are opened at successively lower pressures and preferably are coupled between the coolant system pressurizer 80 and the spargers 74 submerged in the refueling water supply tank 50 in parallel legs along conduits 76. The successively opened conduits 76 are progressively larger for the successive stages, thus venting the coolant circuit 46 more and more completely to the containment 54. The final stage of depressurization, achieved by opening valve means 82, uses the largest conduit 84 and directly couples the coolant circuit 46 to the containment shell 54 (rather than through the spargers 74 in the refueling water supply tank 50), for example, opening into a loop compartment 40 in the containment 54, containing the reactor outlet conduit 56 which leads to a steam generator 30 shown in FIG. 1.

The coolant circuit 46 of the reactor having such a passive safeguard system, including a staged depressurization system, is generally coupled to a residual heat removal system 90, whereby makeup water can be supplied to the coolant circuit 46 before depressurization reaches the final stage. The residual heat removal system 90 normally is activated only during shutdown, for removing normal decay heat from the reactor core. Whereas the residual heat removal system is manually activated, it is not intended as a safety grade apparatus for cooling in the event of an accident. However, by arranging a coupling between the residual heat removal system 90 and the reactor coolant circuit 46, it is possible to use the residual heat removal pumps for moving coolant from the refueling water supply 50 into the cooling circuit 46 before depressurization reaches the last stage or for cooling the water in the refueling water supply 50.

Referring to FIG. 2, a nuclear reactor having a reactor vessel 60 disposed in a containment shell 54, has a normally pressurized cooling circuit 46 including the reactor vessel 60. A refueling water storage tank 50 at atmospheric pressure is coupled to a coolant addition system 92 operable to depressurize the coolant circuit 46 for adding coolant from the refueling water storage tank 50 to the coolant circuit 46 at reduced pressure. A residual heat removal loop 94 having at least one pump 96 and at least one heat exchanger 98, with the residual heat removal loop 94 having an inlet 102 and an outlet 104, is coupled to the cooling circuit 46 by manually operable valves 106, 108 shown in FIGS. 2 and 3. Suitable check valves 109 are provided in series at the outlet 104 of the residual heat removal loop 94.

Figure 3:
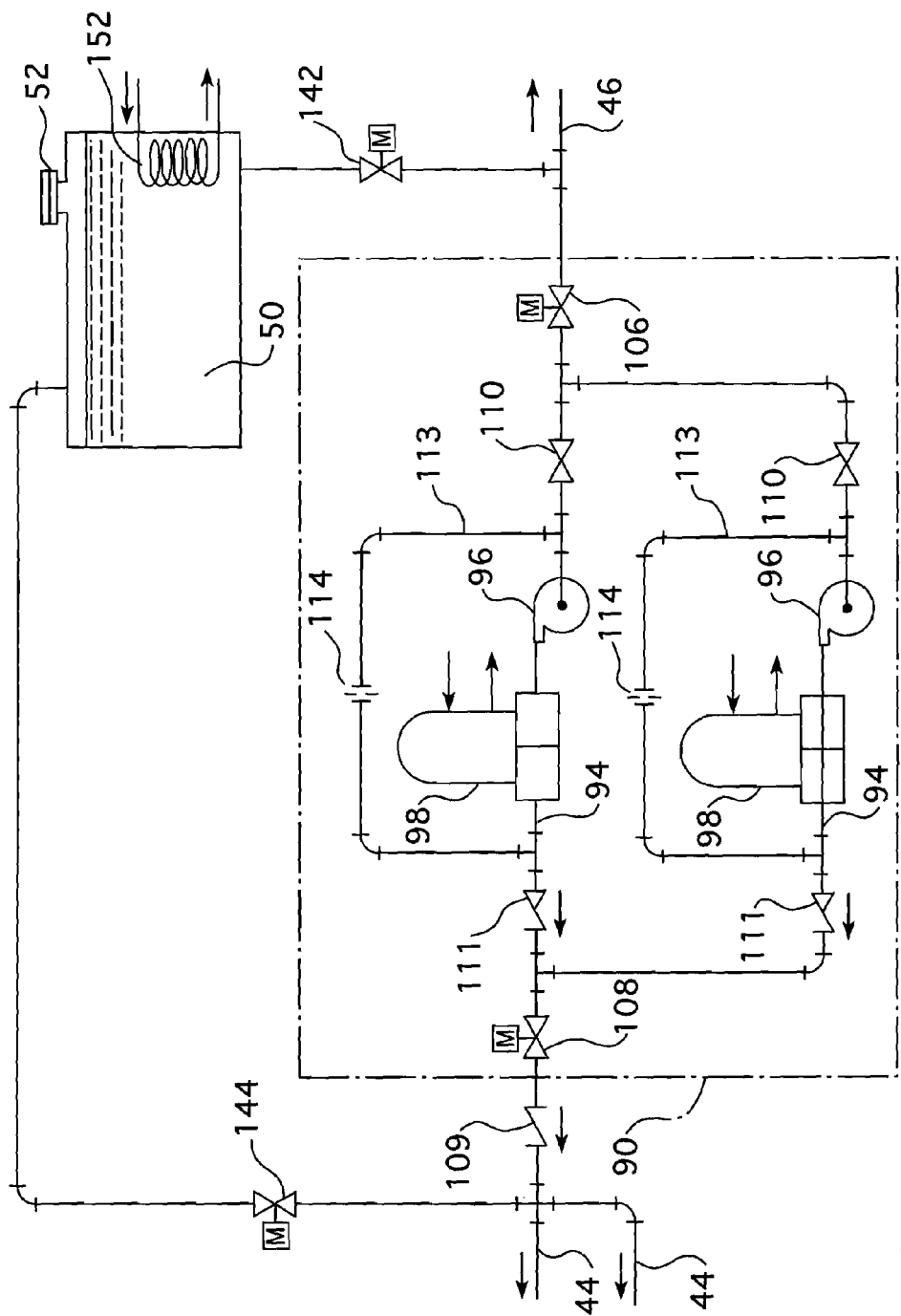
FIG. 3 is a more detailed schematic diagram of the residual heat removal system shown in FIG. 2.

One proposed system for the residual heat removal system is shown in FIG. 3 and includes two residual heat removal legs 94 having respective pumps 96 and heat exchangers 98. When the residual heat removal pumps 96 are coupled by the valves 106, 108 between the refueling water supply 50 and the coolant circuit 46, i.e., during depressurization of the coolant circuit prior to reaching the final stage of depressurization, the pumps 96 inject water from the refueling water supply 50 into the direct vessel injection line 112 so that injection can occur when the reactor coolant circuit pressurization drops to below the shutoff head of the pumps 96.

Inlet isolation valve 110, and outlet stop-check isolation valves 111 separate the two parallel coupled residual heat removal legs 94. The pump 96 can be protected from overpressure problems by including bypass paths 113, having restricted orifices 114 for bleeding off pressure in the event the pumps are activated when the outlet valve 108 is closed or when the pumps 96 cannot exceed the pressure head of the line leading to the reactor injection inlet 44.

Referring to FIG. 2, the stages of depressurization can be triggered based on the level of coolant in the coolant makeup tank 33. For example, the level of coolant can be determined using sensors 122 disposed at different levels on tank 33, coupled to the reactor control system (not shown) for opening the staged depression valves 92 upon reaching a corresponding coolant level.

The pumps 96 discharge into the coolant circuit 46 at a point downstream of the coolant makeup tank 33. Therefore, operation of the pumps 96 can effectively shut off flow from the coolant makeup tank 33. The fluid pressure head loss $H_F$ due to friction between the direct vessel injection port 132 and the connection 134 of the residual heat removal system discharge line 104 is set, by appropriate adjustment of the dimensions of the orifice 133, to be equal to the elevation head difference ($H_{ELEV}$) from connection 134 to the water level 136 in the core makeup tank 33. Therefore, if the head loss $H_F$ from point 132 to point 134 corresponds to the fluid pressure head due to a coolant elevation in the core makeup tank 33 above the coolant elevation at which the final stage depressurization valve 84 opens, then the final stage depressurization valves 82 will not be open during injection of coolant from the residual water supply 50 by the residual heat removal pumps 96. Activation of the residual heat removal system 90 during depressurization thus prevents the automatic depressurization system from advancing to the stage at which the containment is flooded by way of the conduit 84.

Inasmuch as the coolant circuit 46 is pressurized during operation of the reactor, the stages of depressurization involve a loss of coolant from the reactor coolant circuit 46 at varying rates. The venting of steam and water removes coolant from the circuit 46 and moves the coolant into the refueling water supply tank 50 through the spargers 74, or into the containment structure 54 directly via final stage conduit 84. Accordingly, the level of coolant in the core makeup tank 33 falls during operation of the depressurization system. The falling level of the makeup supply triggers the next stage of depressurization, proceeding through each of the stages following initiation of automatic depressurization. The residual heat removal system 90 precludes unnecessary flooding of the containment 54, for example, when the automatic depressurization system is activated inadvertently, or when loss of coolant triggering the initial stage of depressurization is not of a critical nature.

If a critical loss of coolant accident occurs, the residual heat removal system 90 still can be activated manually, without adverse effects. Whether or not the operators activate the residual heat removal pumps 96, if the level in the core makeup tank 33 drops to the level at which final stage depressurization is triggered (e.g., at 25% of the volume of the core makeup tank), the coolant circuit 46 is vented to the containment 54, and coolant flows by gravity from the refueling water supply 50 to the coolant circuit 46 and/or to the bottom of the containment 54, effecting passive cooling.

The preferred valving arrangement as shown in FIG. 3 includes at least one inlet valve 142 coupled to an inlet 102 of the residual heat removal system 90, selectively coupling the residual heat removal system to one of the coolant circuit 46 and the refueling water storage tank 50 and at least one outlet valve 144 coupled to an outlet 104 of the residual heat removal system 90, selectively coupling the residual heat removal system 90 to either the coolant circuit 46 or the refueling water storage tank 50. This provides the further capability of using the residual heat removal system 90 to cool the refueling water storage tank 50. For this purpose, the inlet 102 and the outlet 104 of the residual heat removal system 90 both are coupled to the refueling water supply tank 50, in a coolant loop apart from the reactor coolant circuit 46. Cooling of the refueling water supply 50 is useful in the event a supplemental heat exchanger 152 is arranged in the refueling water supply tank 50, or if the refueling water supply 50 has become heated by operation of the depressurization system to vent steam and hot water into the refueling water supply.

The foregoing discussion in regards to FIGS. 2 and 3 includes only a single core makeup tank and a single direct reactor vessel injection line. In the event the passive cooling system employs more than one high pressure makeup tank and/or direct reactor vessel injection port, as shown in FIG. 1, then it is necessary to couple one or more legs of the residual heat removal system to each of the high pressure tanks and/or direct injection ports, substantially as shown in FIG. 2. For example, in FIG. 3, two direct reactor vessel injection ports 44 are shown coupled to the residual heat removal system.

From the foregoing, it should be appreciated that activation of the automatic depressurization system is a major reactor event that, while necessary to deal safely with a postulated accident, can be extremely costly if set off inadvertently. A concern has been raised over the potential for spurious actuation of the automatic depressurization system due to CCF (Common Cause Failure, i.e., multiple failures due to a single cause or event) of the safety system software. The device of this invention blocks spurious actuation of the automatic depressurization system valves. The device of this invention is designed to be highly reliable and failsafe so that the impact on plant safety due to the increased probability of failure on demand of the automatic depressurization system is minimized. Avoiding a spurious actuation of the automatic depressurization system under normal plant operating conditions will avoid the concern that such an unlikely event could lead to an accident that is more severe than has been analyzed for the plant. The device of this invention blocks actuation of the automatic depressurization system valve under normal plant conditions, when the core makeup tanks are full, to reduce the initiating event frequency of spurious automatic depressurization system actuation. In true accident scenarios, the core makeup tanks are drained in the early stages of the mitigation. Low level in either of these tanks is used by this invention to remove the block signal and allow the safety system to actuate the automatic depressurization system valves as designed.

Figure 4:
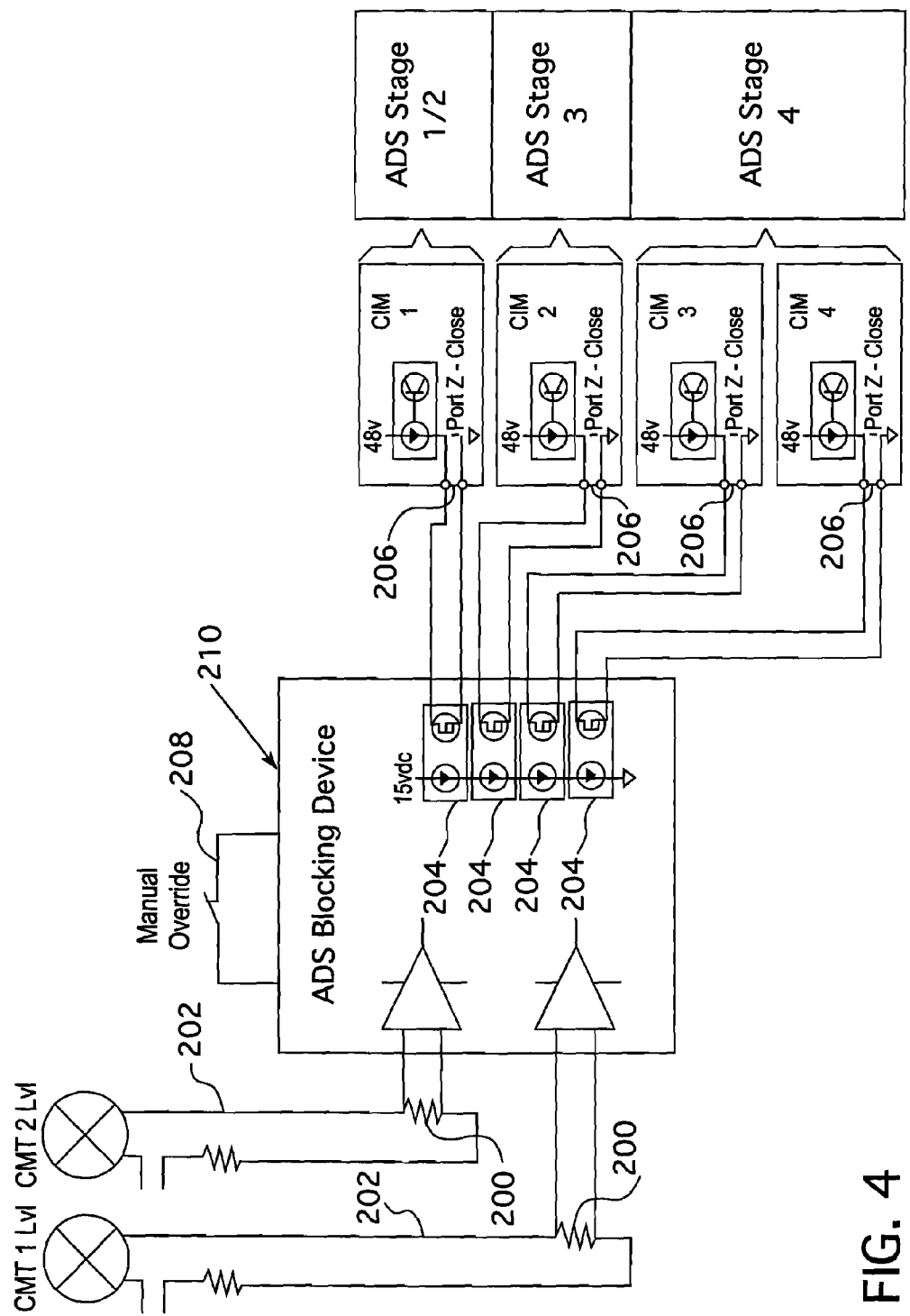
FIG. 4 is a schematic block diagram of the automatic depressurization system blocking device of this invention.

The application of the automatic depressurization system blocking device of this invention is shown in FIG. 4. One blocking device is located in each of the safety system divisions (with four divisions provided for redundancy) to block the actuation of the automatic depressurization system valves in that division. The device accepts two voltage inputs representing the level measurements in the core makeup tanks (CMT1Lvl and CMT2Lvl). These voltages are derived from dropping a 4-20 mA current loop 202 signal, which is shared with the analog inputs of the safety system computer, across a precision 50 ohm resistor 200. This resistor is external to the device, located on the terminal blocks, so that the device may be removed without disrupting the current loop 202.

The device of this invention provides four photo-transistor outputs (MOSFETs) 204 that are connected to the appropriate Z-Port CLOSE input 206 of the Component Interface Module ("CIM"—described in U.S. Pat. No. 6,842,669) that prioritizes commands going to the valves of the automatic depressurization system. The Z-Port has a higher priority than the normal safety system command, so that commanding a valve to CLOSE through the Z-Port will block any OPEN command from the safety system. The photo-transistors 204 provide galvanic isolation between the blocking device 210 and the CIMs, which may be located in different cabinets. The photo-transistors are described and shown as MOSFETs, though it should be appreciated that other alternatives such as bipolar photo-transistors may also be used.

The key requirement of the blocking device 210 is that to the maximum extent practical it should be "failsafe." This means that the component failures should cause the output photo-transistors 204 to turn OFF, thus removing the block of the automatic depressurization system valves. Also, a manual override 208 is provided to allow the operator to remove the block so that the operator can manually operate the automatic depressurization system valves to mitigate an accident or to perform surveillance testing of the valves.

Figure 5:
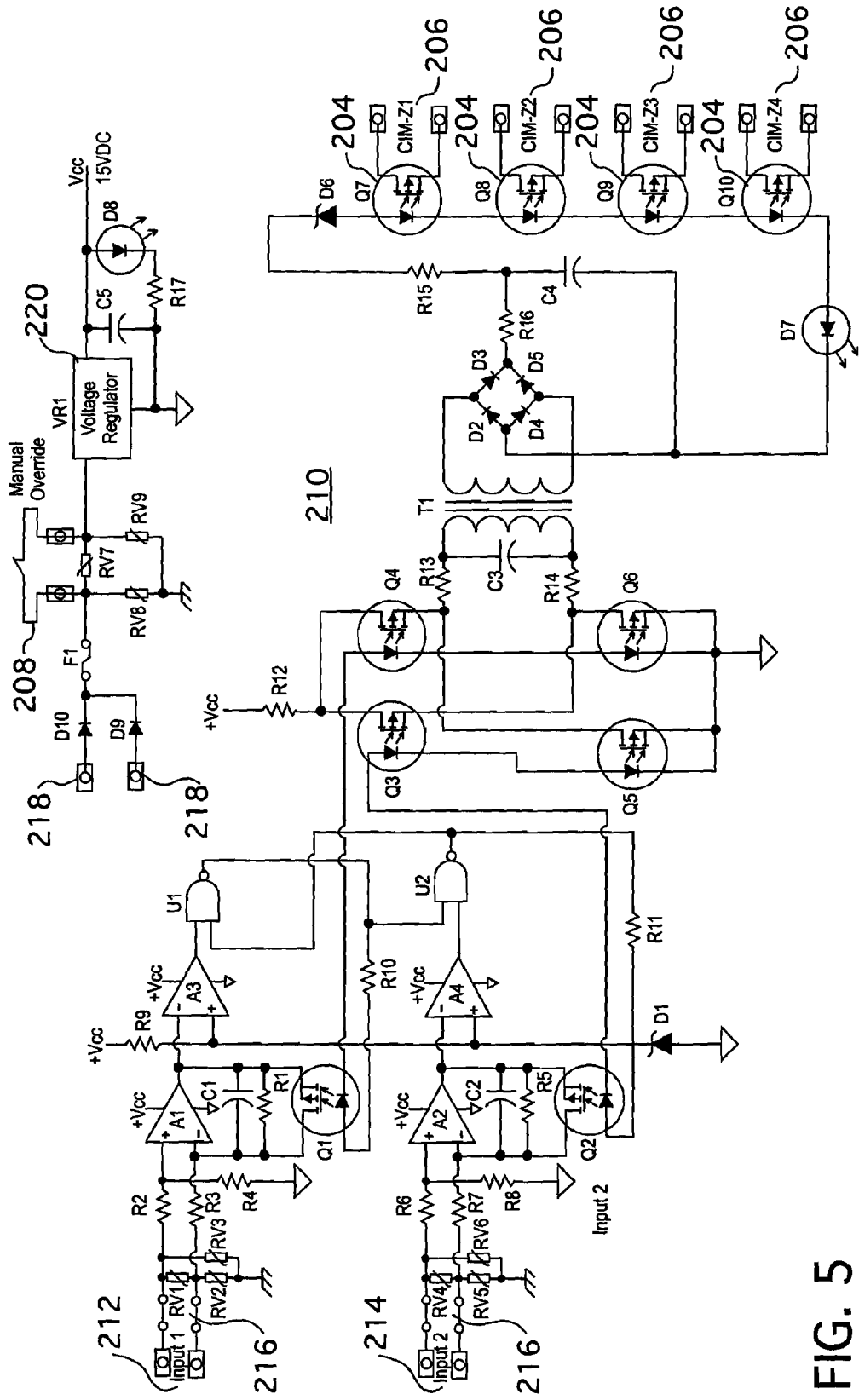
FIG. 5 is a schematic circuitry diagram of the blocking device of this invention.

A preferred embodiment of the circuit of the blocking device of this invention is shown in FIG. 5. The circuit operates as an oscillator that runs as long as the voltage of both inputs 212 and 214 is above a threshold value. The gates U1 and U2 are cross connected to form an R-S flip-flop. The output of one of these gates will be high while the other will be low. Starting from an initial assumption that U1 is low and U2 is high, photo-transistors Q1, Q4 and Q6 will be OFF while photo-transistors Q2, Q3 and Q5 will be ON. Q2 being ON will short the feedback capacitor C2 keeping the output of amplifier A2 at zero. Since the output of A2 is less than the zener diode D1 voltage, the output of comparator A4 will be at the maximum value. Q1 is OFF which allows A1 to integrate the input 212. This operational amplifier circuit is a lag function with a time constant of R1×C1 and a gain of R1/R3. The other resistors of this circuit R2 and R4 are of equal values to R3 and R1, respectively, to provide a balanced impedance for the input.

When the output voltage of A1 increases to a value greater than the zener diode D1 voltage, the comparator A3 output will go to zero thus turning the output of gate U1 high. This high signal combined with a high output of A4 causes the output of gate U2 to go low. The output of gate U2 is connected as an input to U1 which keeps the output of U1 high. With the states of the two gates now reversed, photo-transistors Q1, Q4 and Q6 will be ON while Q2, Q3 and Q5 will be OFF. Q1 being ON will short the feedback capacitor C1 causing the output of amplifier of A1 to return to zero. Q2 is now OFF which allows amplifier A2 to integrate its input voltage 214. The polarity across the primary winding of transformer T1 is reversed. This process alternates between the two inputs, providing an alternating current wave form at the transformer primary, thus causing power conversion to occur to the secondary of the transformer T1. It should also be appreciated that transistors Q1-Q6 need not be photo-coupled, but could alternatively be direct base connected devices.

In the event that either input is less than the threshold set for the zener diode D1 voltage and the R1/R3 (R5/R7) gain, the associated comparator will not switch, the oscillation stops as does the power conversion through the transformer T1. The frequency of the oscillation at normal core makeup tank full conditions is determined by the R1×C1 (R5×C2) time constance. The switching threshold is fixed rather than being adjustable to reduce the chance of drift or the need for a calibration procedure. The set-point to remove the block does not need to be precise as long as it is well away from the full core makeup tank signal and the actuation point where the safety system will legitimately want to open the automatic depressurization system valves.

Resistors R10 and R11 limit the emitter currents through the two chains of photo-transistors Q1, Q4, Q6 and Q2, Q3, Q5. By connecting these emitter LEDs in series, the output drive power from the logic gates U1 and U2 is minimized.

During the polarity switching of the transformer primary, there will be a brief period of a direct short of the power source to ground, for instance, through Q3 and Q6 when they are simultaneously ON. The current through this short is limited by R12 to prevent damage to the transistors. The energy for this short current will temporarily be supplied from the power supply through the capacitor C5.

Resistors R13 and R14, and capacitor C3 provide a low pass filter across the transformer primary winding to make the input waveform more sinusoidal to improve the power conversion. Diodes D2, D3, D4 and D5 form a full wave rectifier on the transformer secondary circuit to convert the AC back to a DC voltage. The power requirement through the transformer is not high. It only needs to drive the emitter LEDs of the output photo-transistors 204. R16 and C4 form a ripple filter to remove the remaining AC component of the transformer output following the full wave rectification. The time response requirement of the blocking device is not particularly fast, so this filter can have a relatively long time constant.

Another alternative is to feedback the transformer T1 secondary voltage, through an appropriately sized resistor and after rectification and filtering (i.e. the voltage on capacitor C4), to the summing junction of comparators A3 and A4. This feedback will cause a small shift to occur in the comparator switching threshold when the oscillation stops, thereby adding hysteresis to the preselected level action point of the blocking device. This hysteresis prevents "chattering" that could occur if the process input (CMT level) hovers near the threshold value.

The current in the emitter LEDs of the output photo-transistor chain 204, i.e., Q7 through Q10 is limited by R15. In addition, a zener diode D6 is included in the emitter circuit so that the output voltage of the transformer must exceed a predetermined value to turn the output transistor ON. The value of the zener diode is selected so that under normal operating conditions, with both inputs 212 and 214 above the threshold and full voltage being sent through the transformer, the outputs will be ON. However, in the event that a failure of one of the transformer primary transistor switches cause the primary voltage to drop to half the normal value, the secondary voltage will drop below the zener diode voltage and the outputs will turn OFF.

LED D7 provides a local indication of the blocker state. This can be used in a manual operability check. Each of the inputs is provided with disconnect/test injection links 216. A quick check can be performed simply by opening a link and observing that the outputs turn OFF. A more protracted test would inject a voltage input into the terminals to determine the threshold at which the oscillation stops.

Power is provided to the blocking device from dual 24 volt DC supplies 218 through auctioneering diodes D8 and D9. This power source is fused, F1, so that a fault in the device, such as a short of the transformer primary transistors, will blow the fuse to prevent propagation to other cabinet devices. This power source is switched by an external, normally closed, contact. This power switch implements the requirement for manual override. The switch may actually be a series connection of switches in the main control room (×2) and at the remote control transfer station (×2), to provide single failure tolerance and multiple control point for the operator override of the block. The voltage level from the dual 24 volt supply 218 is not critical. Alternatively, 48 volt DC supplies may be used to improve the switching characteristics of the series string of manual override switches. In addition to the manual override, other interlocking signals may be included in the series connection of switches. For example, the contact of an under-voltage relay connected to the AC power supply of the safety system can be used to remove the block when the system power is being provided from the back-up batteries following a loss of off-site power sources.

A 15 volt DC voltage regulator 220 provides the Vcc to the device gates and amplifiers. Local power indication is provided by LED D8 with its current being limited by R17.

Surge protection is provided on the two sensor inputs and on the manual override switch by MOVs RV1-RV9. Surge protection is not needed on the outputs since these will be connected to the CIMs in the same cabinet or in a nearby cabinet.

As previously mentioned, high reliability is a key requirement of the automatic depressurization system blocking device because it has the potential to defeat valid actuation of the automatic depressurization system valves. The means used to achieve this high reliability is the "failsafe" design principle. Under this principle, the majority of component failures should either cause the block to be removed, or to not prevent the removal of the block under the condition where one of the two inputs is less than the threshold value.

Table 1 is an FMECA ("Failure Mode, Effects, and Criticality Analysis") of the schematic shown in FIG. 5. For each component in the circuit, the possible failure modes are identified, and the effects (consequences) of those failure modes are stated. The effects are assigned to one of four categories defined as follows:

S1-failsafe; the failure effect removes the ADS block by deenergizing the output transistors;

S2-failure safe; the failure effect does not prevent the deenergizing of the output transistors by one of the inputs being below the threshold;

S3-failsafe; the failure effect prevents output turnoff by one input but does not prevent the other input from being effective; and D-dangerous failure; one or more of the output transistors will not turn off when the input is below the threshold value.

In addition to categorizing the failure effects, the "detectability" of the failure is identified with a D or U (for Detectable or Undetectable, respectively). This device does not have a continuous diagnostic capability. Instead, a simple check can be made by manually opening each of the inputs in turn and verifying that the automatic depressurization signal block signals at the CIM Z-Ports are removed. The CIM Z-Ports are monitored by the plant computer system. If any of the blocks are removed under normal operating conditions without the check being done, this would also indicate a block device failure. The check would also include a test of the manual override by operating the switch in the control room. Any failures not reviewed by this simple check are identified as Undetectable. Such failures would be revealed by a comprehensive bench test of the device that measures waveforms and specific component failures done during plant shutdown.

Failure rates for each component are included in Table 1 based on the component failure rate models found in the reliability information and analysis (RIAC) tool 217Plus. These are expressed in the units Failures In Time (FIT) which are failures per $10^9$ hours of calendar time. The relative likelihood of the various failure modes is shown in the Alpha column, and is taken from the RIAC publication, CRTA-FMECA. The product of the FIT and Alpha columns produces the failure rate of the specific failure mode.

Table 2 is a summary of the failsafe modes of the device. 87.7 percent of all failures result in one of the three safe conditions identified. The dangerous failure modes are: 1) short or low off resistance of one of the output FETs; 2) short of the surge suppressor across the manual override switch; and 3) change in the zener voltage of threshold reference D1. The first two of these would be detected by the simple check described previously. If this check is performed quarterly, then the probability of dangerous failure on demand of the blocking device is extremely low when coupled with the low frequency of spurious actuation due to safety system software failure, and should be sufficient to put this accident scenario outside of design basis consideration.

TABLE 1

| | | ADS Blocking Device FMECA | | | | | |
|---|---|---|---|---|---|---|---|
| REF | FAILURE MODE | EFFECT | SAFE | DET | ALPHA | FIT | PROD |
| A1 | Output Stuck High | U1 stays high; Q4 and Q6 stay ON; power supply is shorted through R12 when Q3 and Q5 turn ON; fuse blows | S1 | D | 0.45 | 3.9 | 1.755 |
| A1 | Output Stuck Low | U1 stays low; oscillation stops; T1 voltage drops; output FETs turn OFF | S1 | D | 0.45 | 3.9 | 1.755 |
| A1 | Unstable Oscillation | Oscillation frequency above T1 primary filter; T1 voltage drops; output FETs turn OFF | S1 | D | 0.10 | 3.9 | .039 |
| A2 | Output Stuck high | U2 stays high; Q3 and Q5 stay ON; power supply is shorted through R12 when Q4 and Q6 turn ON; fuse blows | S1 | D | 0.45 | 3.9 | 1.755 |

TABLE 1-continued

ADS Blocking Device FMECA

| REF | FAILURE MODE | EFFECT | SAFE | DET | ALPHA | FIT | PROD |
|---|---|---|---|---|---|---|---|
| A2 | Output Stuck Low | U2 stays low; oscillation stops; T1 voltage drops; output FETs turn OFF | S1 | D | 0.45 | 3.9 | 1.755 |
| A2 | Unstable Oscillation | Oscillation frequency above T1 primary filter; T1 voltage drops; output FETs turn OFF | S1 | D | 0.10 | 3.9 | .039 |
| A3 | Output Stuck High | U1 stays low; oscillation stops; T1 voltage drops; output FETs turn OFF | S1 | D | 0.50 | 3.9 | 1.95 |
| A3 | Output Stuck Low | U1 stays high; Q4 and Q6 stay ON; power supply is shorted through R12 when Q3 and Q5 turn ON; fuse blows | S1 | D | 0.50 | 3.9 | 1.95 |
| A4 | Output Stuck High | U2 stays low; oscillation stops; T1 voltage drops; output FETs turn OFF | S1 | D | 0.50 | 3.9 | 1.95 |
| A4 | Output Stuck Low | U2 stays high; Q3 and Q5 stay ON; power supply is shorted through R12 when Q4 and Q6 turn ON; fuse blows | S1 | D | 0.50 | 3.9 | 1.95 |
| C1 | Short | A1 stays low; oscillation stops; T1 voltage drops; output FETs turn OFF | S1 | D | 0.49 | 4.8 | 2.352 |
| C1 | Change in Value | Shift in oscillation frequency; small change does not affect operation | S2 | U | 0.29 | 4.8 | 1.392 |
| C1 | Open | A1 goes high as soon as Q1 is OFF; duty cycle has large change; T1 voltage drops; output FETs turn OFF | S1 | D | 0.22 | 4.8 | 1.056 |
| C2 | Short | A2 stays low; oscillation stops; T1 voltage drops; output FETs turn OFF | S1 | D | 0.49 | 4.8 | 2.352 |
| C2 | Change in Value | Shift in oscillation frequency; small change does not affect operation | S2 | U | 0.29 | 4.8 | 1.392 |
| C2 | Open | A2 goes high as soon as Q1 is OFF; duty cycle has large change; T1 voltage drops; output FETs turn OFF | S1 | D | 0.22 | 4.8 | 1.056 |
| C3 | Short | T1 primary shorted; T1 output voltage drops; output FETs turn OFF | S1 | D | 0.49 | 4.8 | 2.352 |
| C3 | Change in Value | More harmonics in T1 voltage; small change does not affect operation | S2 | U | 0.29 | 4.8 | 1.392 |
| C3 | Open | T1 input is square wave; secondary voltage is highly peaked wave form; RMS voltage drops; output FETs turn OFF | S1 | D | 0.22 | 4.8 | 1.056 |
| C4 | Short | Output drive voltage shorted; output FETs turn OFF | S1 | D | 0.69 | 0.83 | 0.5727 |
| C4 | Open | High ripple on FET drive voltage; intermittent turning OFF of blocks noticed by CIM monitor | S2 | D | 0.17 | 0.83 | 0.1411 |
| C4 | Change in Value | Increase in voltage ripple; small change does not affect operation | S2 | U | 0.14 | 0.83 | 0.1162 |
| C5 | Short | Power supply to device drops to zero; fuse blows | S1 | D | 0.69 | 0.83 | 0.5727 |
| C5 | Open | Switching transients may disrupt oscillation; does not prevent turn-off when inputs are low | S2 | U | 0.17 | 0.83 | 0.1411 |
| C5 | Change in Value | Increase in voltage ripple; small change does not affect operation | S2 | U | 0.14 | 0.83 | 0.1162 |
| D1 | Parameter Change voltage increase | Input amps cannot achieve threshold; oscillation stops; output FETs are turned OFF | S1 | D | 0.35 | 3.4 | 1.19 |

TABLE 1-continued

ADS Blocking Device FMECA

| REF | FAILURE MODE | EFFECT | SAFE | DET | ALPHA | FIT | PROD |
|---|---|---|---|---|---|---|---|
| D1 | Parameter Change voltage decrease | Change in switching threshold may cause block to not be removed in time | D | U | 0.35 | 3.4 | 1.19 |
| D1 | Open | Input amps cannot achieve threshold; oscillation stops; output FETs are turned OFF | S1 | D | 0.17 | 3.4 | 0.578 |
| D1 | Short | Threshold exceeded early in each cycle; oscillation frequency increases significantly above T1 filter; T1 voltage drops; output FETs turn OFF | S1 | D | 0.13 | 3.4 | 0.442 |
| D2 | Short | T1 secondary shorted for half cycle; RMS voltage drops; output FETs turn OFF | S1 | D | 0.51 | 1.3 | 0.663 |
| D2 | Open | Increased ripple; decreased RMS voltage; D6 blocks output FETs from turning ON | S1 | D | 0.29 | 1.3 | 0.377 |
| D2 | Parameter Change | Design not sensitive to component parameters | S2 | U | 0.20 | 1.3 | 0.26 |
| D3 | Short | T1 secondary shorted for half cycle; RMS voltage drops; output FETs turn OFF | S1 | D | 0.51 | 1.3 | 0.663 |
| D3 | Open | Increased ripple; decreased RMS voltage; D6 blocks output FETs from turning ON | S1 | D | 0.29 | 1.3 | 0.377 |
| D3 | Parameter Change | Design not sensitive to component parameters | S2 | U | 0.20 | 1.3 | 0.26 |
| D4 | Short | T1 secondary shorted for half cycle; RMS voltage drops; output FETs turn OFF | S1 | D | 0.51 | 1.3 | 0.663 |
| D4 | Open | Increased ripple; decreased RMS voltage; D6 blocks output FETs from turning ON | S1 | D | 0.29 | 1.3 | 0.377 |
| D4 | Parameter Change | Design not sensitive to component parameters | S2 | U | 0.20 | 1.3 | 0.26 |
| D5 | Short | T1 secondary shorted for half cycle; RMS voltage drops; output FETs turn OFF | S1 | D | 0.51 | 1.3 | 0.663 |
| D5 | Open | Increased ripple; decreased RMS voltage; D6 blocks output FETs from turning ON | S1 | D | 0.29 | 1.3 | 0.377 |
| D5 | Parameter Change | Design not sensitive to component parameters | S2 | U | 0.20 | 1.3 | 0.26 |
| D6 | Parameter Change | Fault tolerance to voltage reducing failures is reduced by normal operation is not affected | S2 | U | 0.69 | 3.4 | 2.346 |
| D6 | Open | Emitter circuit of output FETs is open; output FETs are turned OFF | S1 | D | 0.18 | 3.4 | 0.612 |
| D6 | Short | High current through FET emitters causes consequential failures; one or more FETs turn OFF | S1 | D | 0.13 | 3.4 | 0.442 |
| D7 | Open | Emitter circuit of output FETs is open; output FETs are turned OFF | S1 | D | 0.70 | 0.13 | 0.019 |
| D7 | Short | Local indication of block inoperative; does not affect operation | S2 | D | 0.30 | 0.13 | 0.039 |
| D8 | Open | Local indication of power is inoperative; does not affect operation | S2 | D | 0.70 | 0.13 | 0.091 |
| D8 | Short | Power supply is shorted; fuse blows | S1 | D | 0.30 | 0.13 | 0.039 |
| D9 | Short | Fault tolerance for power supplies reduced; does not affect device operation | S2 | U | 0.51 | 1.3 | 0.663 |
| D9 | Open | Fault tolerance for power supplies reduced; does not affect device operation | S2 | U | 0.29 | 1.3 | 0.377 |
| D9 | Parameter Change | Design not sensitive to component parameters | S2 | U | 0.20 | 1.3 | 0.26 |

TABLE 1-continued

ADS Blocking Device FMECA

| REF | FAILURE MODE | EFFECT | SAFE | DET | ALPHA | FIT | PROD |
|---|---|---|---|---|---|---|---|
| D10 | Short | Fault tolerance for power supplies reduced; does not affect device operation | S2 | U | 0.51 | 1.3 | 0.663 |
| D10 | Open | Fault tolerance for power supplies reduced; does not affect device operation | S2 | U | 0.29 | 1.3 | 0.377 |
| D10 | Parameter Change | Design not sensitive to component parameters | S2 | U | 0.20 | 1.3 | 0.26 |
| F1 | Fails to Open | Fault on device could propagate to protection devices of power supplies; may not clear | S2 | U | 0.49 | 49 | 24.01 |
| F1 | Slow to Open | Fault on device could propagate to protection devices of power supplies; may not clear | S2 | U | 0.43 | 49 | 21.07 |
| F1 | Premature Open | Power to device is removed; output FETs turn OFF | S1 | D | 0.08 | 49 | 3.92 |
| Q1 | Short | A1 stays low; oscillation stops; T1 voltage drops; output FETs turn OFF | S1 | D | 0.51 | 15 | 7.65 |
| Q1 | Output Low Res when OFF | A1 gain is reduced; full input does not reach switching threshold; oscillation stops | S1 | D | 0.22 | 15 | 3.3 |
| Q1 | Parameter Change | Design not sensitive to component parameters | S2 | U | 0.17 | 15 | 2.55 |
| Q1 | Open | C1 does not discharge; A1 remains high; power supply is shorted through R12 when Q3 and Q5 turn on; fuse blows | S1 | D | 0.05 | 15 | 0.75 |
| Q1 | Output High Res when ON | C1 does not fully discharge; oscillation frequency will increase and duty cycle shift; T1 voltage drops; D6 prevents output FET turn-on | S1 | D | 0.05 | 15 | 0.75 |
| Q2 | Short | A2 stays low; oscillation stops; T1 voltage drops; output FETs turn OFF | S1 | D | 0.51 | 15 | 7.65 |
| Q2 | Output Low Res when OFF | A2 gain is reduced; full input does not reach switching threshold; oscillation stops | S1 | D | 0.22 | 15 | 3.3 |
| Q2 | Parameter Change | Design not sensitive to component parameters | S2 | U | 0.17 | 15 | 2.55 |
| Q2 | Open | C2 does not discharge; A2 remains high; power supply is shorted through R12 when Q4 and Q6 turn on; fuse blows | S1 | D | 0.05 | 15 | 0.75 |
| Q2 | Output High Res when ON | C2 does not fully discharge; oscillation frequency will increase and duty cycle shift; T1 voltage drops; D6 prevents output FET turn-on | S1 | D | 0.05 | 15 | 0.75 |
| Q3 | Short | Power supply is shorted through R12 when Q6 turns ON; fuse blows | S1 | D | 0.51 | 15 | 7.65 |
| Q3 | Output Low Res when OFF | T1 voltage drops; D6 blocks output FETs from turning on | S1 | D | 0.22 | 15 | 3.3 |
| Q3 | Parameter Change | Design not sensitive to component parameters | S2 | U | 0.17 | 15 | 2.55 |
| Q3 | Open | T1 voltage drops; D6 blocks output FETs from turning on | S1 | D | 0.05 | 15 | 0.75 |
| Q3 | Output High Res when ON | T1 voltage drops; D6 blocks output FETs from turning on | S1 | D | 0.05 | 15 | 0.75 |
| Q4 | Short | Power supply is shorted through R12 when Q5 turns ON; fuse blows | S1 | D | 0.51 | 15 | 7.65 |
| Q4 | Output Low Res when OFF | T1 voltage drops; D6 blocks output FETs from turning on | S1 | D | 0.22 | 15 | 3.3 |
| Q4 | Parameter Change | Design not sensitive to component parameters | S2 | U | 0.17 | 15 | 2.55 |

TABLE 1-continued

ADS Blocking Device FMECA

| REF | FAILURE MODE | EFFECT | SAFE | DET | ALPHA | FIT | PROD |
|---|---|---|---|---|---|---|---|
| Q4 | Open | T1 voltage drops; D6 blocks output FETs from turning on | S1 | D | 0.05 | 15 | 0.75 |
| D8 | Open | Local indication of power is inoperative; does not affect operation | S2 | D | 0.70 | 0.13 | 0.091 |
| D8 | Short | Power supply is shorted; fuse blows | S1 | D | 0.30 | 0.13 | 0.039 |
| D9 | Short | Fault tolerance for power supplies reduced; does not affect device operation | S2 | U | 0.51 | 1.3 | 0.663 |
| D9 | Open | Fault tolerance for power supplies reduced; does not affect device operation | S2 | U | 0.29 | 1.3 | 0.377 |
| Q4 | Output High Res when ON | T1 voltage drops; D6 blocks output FETs from turning on | S1 | D | 0.05 | 15 | 0.75 |
| Q5 | Short | Power supply is shorted through R12 when Q4 turns ON; fuse blows | S1 | D | 0.51 | 15 | 7.65 |
| Q5 | Output Low Res when OFF | T1 voltage drops; D6 blocks output FETs from turning on | S1 | D | 0.22 | 15 | 3.3 |
| Q5 | Parameter Change | Design not sensitive to component parameters | S2 | U | 0.17 | 15 | 2.55 |
| Q5 | Open | T1 voltage drops; D6 blocks output FETs from turning on | S1 | D | 0.05 | 15 | 0.75 |
| Q5 | Output High Res when ON | T1 voltage drops; D6 blocks output FETs from turning on | S1 | D | 0.05 | 15 | 0.75 |
| Q6 | Short | Power supply is shorted through R12 when Q3 turns ON; fuse blows | S1 | D | 0.51 | 15 | 7.65 |
| Q6 | Output Low Res when OFF | T1 voltage drops; D6 blocks output FETs from turning on | S1 | D | 0.22 | 15 | 3.3 |
| Q6 | Parameter Change | Design not sensitive to component parameters | S2 | U | 0.17 | 15 | 2.55 |
| Q6 | Open | T1 voltage drops; D6 blocks output FETs from turning on | S1 | D | 0.05 | 15 | 0.75 |
| Q6 | Output High Res when ON | T1 voltage drops; D6 blocks output FETs from turning on | S1 | D | 0.05 | 15 | 0.75 |
| Q7 | Short | CIM Z-Port stuck ON | D | D | 0.51 | 15 | 7.65 |
| Q7 | Output Low Res when OFF | CIM Z-Port may be ON when block is removed | D | D | 0.22 | 15 | 3.3 |
| Q7 | Parameter Change | Design not sensitive to component parameters | S2 | U | 0.17 | 15 | 2.55 |
| Q7 | Open | CIM Z-port stuck OFF; block removed for affected component | S1 | D | 0.05 | 15 | 0.75 |
| Q7 | Output High Res when ON | CIM Z-port may be OFF; block may be removed for affected component | S1 | D | 0.05 | 15 | 0.75 |
| Q8 | Short | CIM Z-Port stuck ON | D | D | 0.51 | 15 | 7.65 |
| Q8 | Output Low Res when OFF | CIM Z-Port may be ON when block is removed | D | D | 0.22 | 15 | 3.3 |
| Q8 | Parameter Change | Design not sensitive to component parameters | S2 | U | 0.17 | 15 | 2.55 |
| Q8 | Open | CIM Z-port stuck OFF; block removed for affected component | S1 | D | 0.05 | 15 | 0.75 |
| Q8 | Output High Res when ON | CIM Z-port may be OFF; block may be removed for affected component | S1 | D | 0.05 | 15 | 0.75 |
| Q9 | Short | CIM Z-Port stuck ON | D | D | 0.51 | 15 | 7.65 |
| Q9 | Output Low Res when OFF | CIM Z-Port may be ON when block is removed | D | D | 0.22 | 15 | 3.3 |
| Q9 | Parameter Change | Design not sensitive to component parameters | S2 | U | 0.17 | 15 | 2.55 |
| Q9 | Open | CIM Z-port stuck OFF; block removed for affected component | S1 | D | 0.05 | 15 | 0.75 |

TABLE 1-continued

ADS Blocking Device FMECA

| REF | FAILURE MODE | EFFECT | SAFE | DET | ALPHA | FIT | PROD |
|---|---|---|---|---|---|---|---|
| Q9 | Output High Res when ON | CIM Z-port may be OFF; block may be removed for affected component | S1 | D | 0.05 | 15 | 0.75 |
| Q10 | Short | CIM Z-Port stuck ON | D | D | 0.51 | 15 | 7.65 |
| Q10 | Output Low Res when OFF | CIM Z-Port may be ON when block is removed | D | D | 0.22 | 15 | 3.3 |
| Q10 | Parameter Change | Design not sensitive to component parameters | S2 | U | 0.17 | 15 | 2.55 |
| Q10 | Open | CIM Z-port stuck OFF; block removed for affected component | S1 | D | 0.05 | 15 | 0.75 |
| Q10 | Output High Res when ON | CIM Z-port may be OFF; block may be removed for affected component | S1 | D | 0.05 | 15 | 0.75 |
| R1 | Open | A1 integrates to Vcc; exceeds threshold even at low input | S3 | U | 0.59 | 1.6 | 0.944 |
| R1 | Parameter Change | A1 gain is changed; may not switch at threshold | S3 | U | 0.36 | 1.6 | 0.576 |
| R1 | Short | A1 stays low; oscillation stops; T1 voltage drops; output FETs turn OFF | S1 | D | 0.05 | 1.6 | 0.08 |
| R2 | Open | A1 stays low; oscillation stops; T1 voltage drops; output FETs turn OFF | S1 | D | 0.59 | 1.6 | 0.944 |
| R2 | Parameter Change | A1 gain is changed; may not switch at threshold | S3 | U | 0.36 | 1.6 | 0.576 |
| R2 | Short | A1 gain is changed; may not switch at threshold | S3 | U | 0.05 | 1.6 | 0.08 |
| R3 | Open | A1 stays low; oscillation stops; T1 voltage drops; output FETs turn OFF | S1 | D | 0.59 | 1.6 | 0.944 |
| R3 | Parameter Change | A1 gain is changed; may not switch at threshold | S3 | U | 0.36 | 1.6 | 0.576 |
| R3 | Short | A1 gain is changed; may not switch at threshold | S3 | U | 0.05 | 1.6 | 0.08 |
| R4 | Open | Common mode noise rejection capability is reduced but does not affect operation | S2 | U | 0.59 | 1.6 | 0.944 |
| R4 | Parameter Change | A1 gain is changed; may not switch at threshold | S3 | U | 0.36 | 1.6 | 0.576 |
| R4 | Short | A1 gain is changed; may not switch at threshold | S3 | U | 0.05 | 1.6 | 0.08 |
| R5 | Open | A2 integrates to Vcc; exceeds threshold even at low input | S3 | U | 0.59 | 1.6 | 0.944 |
| R5 | Parameter Change | A2 gain is changed; may not switch at threshold | S3 | U | 0.36 | 1.6 | 0.576 |
| R5 | Short | A2 stays low; oscillation stops; T1 voltage drops; output FETs turn OFF | S1 | D | 0.05 | 1.6 | 0.08 |
| R6 | Open | A2 stays low; oscillation stops; T1 voltage drops; output FETs turn OFF | S1 | D | 0.59 | 1.6 | 0.944 |
| R6 | Parameter Change | A2 gain is changed; may not switch at threshold | S3 | U | 0.36 | 1.6 | 0.576 |
| R6 | Short | A2 gain is changed; may not switch at threshold | S3 | U | 0.05 | 1.6 | 0.08 |
| R7 | Open | A2 stays low; oscillation stops; T1 voltage drops; output FETs turn OFF | S1 | D | 0.59 | 1.6 | 0.944 |
| R7 | Parameter Change | A2 gain is changed; may not switch at threshold | S3 | U | 0.36 | 1.6 | 0.576 |
| R8 | Open | Common mode noise rejection capability is reduced but does not affect operation | S2 | U | 0.59 | 1.6 | 0.944 |
| R8 | Parameter Change | A2 gain is changed; may not switch at threshold | S3 | U | 0.36 | 1.6 | 0.576 |
| R8 | Short | A2 gain is changed; may not switch at threshold | S3 | U | 0.05 | 1.6 | 0.08 |
| R9 | Open | Reference voltage for threshold drops to zero; switching occurs rapidly; T1 primary filter reduces voltage to transformer; D6 blocks output FETs from turning ON | S1 | D | 0.59 | 1.6 | 0.944 |

TABLE 1-continued

ADS Blocking Device FMECA

| REF | FAILURE MODE | EFFECT | SAFE | DET | ALPHA | FIT | PROD |
|---|---|---|---|---|---|---|---|
| R9 | Parameter Change | Design not sensitive to component parameters | S2 | U | 0.36 | 1.6 | 0.576 |
| R9 | Short | Excessive current through D1 causes failure of this diode; threshold increases to Vcc; switching stops | S1 | D | 0.05 | 1.6 | 0.08 |
| R10 | Open | Q1, Q4 and Q6 do not turn ON; oscillation stops | S1 | D | 0.59 | 1.6 | 0.944 |
| R10 | Parameter Change | Design not sensitive to component parameters | S2 | U | 0.36 | 1.6 | 0.576 |
| R10 | Short | Excessive current through Q1, Q3 and Q5 emitters causes failure of one or more of these devices | S1 | D | 0.05 | 1.6 | 0.08 |
| R11 | Open | Q2, Q3 and Q5 do not turn ON; oscillation stops | S1 | D | 0.59 | 1.6 | 0.944 |
| R11 | Parameter Change | Design not sensitive to component parameters | S2 | U | 0.36 | 1.6 | 0.576 |
| R11 | Short | Excessive current through Q2, Q4 and Q6 emitters causes failure of one or more of these devices | S1 | D | 0.05 | 1.6 | 0.08 |
| R12 | Open | Loss of primary voltage to T1; output FETs turn OFF | S1 | D | 0.59 | 1.6 | 0.944 |
| R12 | Parameter Change | Design not sensitive to component parameters | S2 | U | 0.36 | 1.6 | 0.576 |
| R12 | Short | Switching transients may disrupt oscillation; does not prevent turn-off when inputs are low | S2 | U | 0.05 | 1.6 | 0.08 |
| R12 | Open | Loss of primary voltage to T1; output FETs turn OFF | S1 | D | 0.59 | 1.6 | 0.944 |
| R12 | Parameter Change | Design not sensitive to component parameters | S2 | U | 0.36 | 1.6 | 0.576 |
| R12 | Short | Change in filter cutoff frequency; may reduce tolerance of other faults but does not prevent normal operation | S2 | U | 0.05 | 1.6 | 0.08 |
| R14 | Open | Loss of primary voltage to T1; output FETs turn OFF | S1 | D | 0.59 | 1.6 | 0.944 |
| R14 | Parameter Change | Design not sensitive to component parameters | S2 | U | 0.36 | 1.6 | 0.576 |
| R14 | Short | Change in filter cutoff frequency; may reduce tolerance of other faults but does not prevent normal operation | S2 | U | 0.05 | 1.6 | 0.08 |
| R15 | Open | Emitter circuit of output FETs is open; output FETs are turned OFF | S1 | D | 0.59 | 1.6 | 0.944 |
| R15 | Parameter Change | Design not sensitive to component parameters | S2 | U | 0.36 | 1.6 | 0.576 |
| R15 | Short | High current through FET emitters causes consequential failures; one or more FETs turn OFF | S1 | D | 0.05 | 1.6 | 0.08 |
| R16 | Open | Emitter circuit of output FETs is open; output FETs are turned OFF | S1 | D | 0.59 | 1.6 | 0.944 |
| R16 | Parameter Change | Design not sensitive to component parameters | S2 | U | 0.36 | 1.6 | 0.576 |
| R16 | Short | High ripple on FET drive voltage; intermittent turning OFF of blocks noticed by CIM monitor | S2 | D | 0.05 | 1.6 | 0.08 |
| R17 | Open | Local indication of power is inoperative; does not affect operation | S2 | D | 0.59 | 1.6 | 0.944 |
| R17 | Parameter Change | Design not sensitive to component parameters | S2 | U | 0.36 | 1.6 | 0.576 |
| R17 | Short | Power supply is shorted; fuse blows | S1 | D | 0.05 | 1.6 | 0.08 |

TABLE 1-continued

ADS Blocking Device FMECA

| REF | FAILURE MODE | EFFECT | SAFE | DET | ALPHA | FIT | PROD |
|---|---|---|---|---|---|---|---|
| RV1 | Open | Surge withstand capability reduced but normal operation is not affected | S2 | U | 0.45 | 3.4 | 1.53 |
| RV1 | Parameter Change | Design not sensitive to component parameters | S2 | U | 0.35 | 3.4 | 1.19 |
| RV1 | Short | A1 stays low; oscillation stops; T1 voltage drops; output FETs turn OFF | S1 | D | 0.20 | 3.4 | 0.68 |
| RV2 | Open | Surge withstand capability reduced but normal operation is not affected | S2 | U | 0.45 | 3.4 | 1.53 |
| RV2 | Parameter Change | Design not sensitive to component parameters | S2 | U | 0.35 | 3.4 | 1.19 |
| RV2 | Short | Surge withstand capability reduced but normal operation is not affected | S2 | U | 0.20 | 3.4 | 0.68 |
| RV3 | Open | Surge withstand capability reduced but normal operation is not affected | S2 | U | 0.45 | 3.4 | 1.53 |
| RV3 | Parameter Change | Design not sensitive to component parameters | S2 | U | 0.35 | 3.4 | 1.19 |
| RV3 | Short | Surge withstand capability reduced but normal operation is not affected | S2 | U | 0.20 | 3.4 | 0.68 |
| RV4 | Open | Surge withstand capability reduced but normal operation is not affected | S2 | U | 0.45 | 3.4 | 1.53 |
| RV4 | Parameter Change | Design not sensitive to component parameters | S2 | U | 0.35 | 3.4 | 1.19 |
| RV4 | Short | A2 stays low; oscillation stops; T1 voltage drops; output FETs turn OFF | S1 | D | 0.20 | 3.4 | 0.68 |
| RV5 | Open | Surge withstand capability reduced but normal operation is not affected | S2 | U | 0.45 | 3.4 | 1.53 |
| RV5 | Parameter Change | Design not sensitive to component parameters | S2 | U | 0.35 | 3.4 | 1.19 |
| RV5 | Short | Surge withstand capability reduced but normal operation is not affected | S2 | U | 0.20 | 3.4 | 0.68 |
| RV6 | Open | Open Surge withstand capability reduced but normal operation is not affected | S2 | U | 0.45 | 3.4 | 1.53 |
| RV6 | Parameter Change | Design not sensitive to component parameters | S2 | U | 0.35 | 3.4 | 1.19 |
| RV6 | Short | Surge withstand capability reduced but normal operation is not affected | S2 | U | 0.20 | 3.4 | 0.68 |
| RV7 | Open | Surge withstand capability reduced but normal operation is not affected | S2 | U | 0.45 | 3.4 | 1.53 |
| RV7 | Parameter Change | Design not sensitive to component parameters | S2 | U | 0.35 | 3.4 | 1.19 |
| RV7 | Short | Manual override of block is inoperative | D | D | 0.20 | 3.4 | 0.68 |
| RV8 | Open | Surge withstand capability reduced but normal operation is not affected | S2 | U | 0.45 | 3.4 | 1.53 |
| RV8 | Parameter Change | Design not sensitive to component parameters | S2 | U | 0.35 | 3.4 | 1.19 |
| RV8 | Short | Surge withstand capability reduced but normal operation is not affected | S2 | U | 0.20 | 3.4 | 0.68 |
| RV9 | Open | Surge withstand capability reduced but normal operation is not affected | S2 | U | 0.45 | 3.4 | 1.53 |
| RV9 | Parameter Change | Design not sensitive to component parameters | S2 | U | 0.35 | 3.4 | 1.19 |
| RV9 | Short | Surge withstand capability reduced but normal operation is not affected | S2 | U | 0.20 | 3.4 | 0.68 |
| T1 | Open | Secondary voltage become zero; output FETs turn OFF | S1 | D | 0.42 | 63 | 26.46 |

TABLE 1-continued

ADS Blocking Device FMECA

| REF | FAILURE MODE | EFFECT | SAFE | DET | ALPHA | FIT | PROD |
|---|---|---|---|---|---|---|---|
| T1 | Short | Secondary voltage become zero; output FETs turn OFF | S1 | D | 0.42 | 63 | 26.46 |
| T1 | Parameter Change | Design not sensitive to component parameters | S2 | U | 0.16 | 63 | 10.08 |
| U1 | Input Open from A3 | U1 stays low; oscillation stops; T1 voltage drops; output FETs turn OFF | S1 | D | 0.18 | 1.1 | 0.198 |
| U1 | Input Open from U2 | U1 goes OFF immediately after turning ON; duty cycle has large change; T1 voltage drops; output FETs turn OFF | S1 | D | 0.18 | 1.1 | 0.198 |
| U1 | Output Open | No drive current for Q1, Q4 and Q6; T1 voltage drops; oscillation stops | S1 | D | 0.36 | 1.1 | 0.396 |
| U1 | Supply Open | No drive current for Q1, Q4 and Q6; T1 voltage drops; oscillation stops | S1 | D | 0.12 | 1.1 | 0.132 |
| U1 | Output Stuck Low | Oscillation stops; T1 voltage drops; output FETs turn OFF | S1 | D | 0.08 | 1.1 | 0.088 |
| U1 | Output Stuck High | Q4 and Q6 stay ON; power supply is shorted through R12 and Q3 and Q5 turn ON; fuse blows | S1 | D | 0.08 | 1.1 | 0.088 |
| U2 | Input Open from A4 | U2 stays low; oscillation stops; T1 voltage drops; output FETs turn OFF | S1 | D | 0.18 | 1.1 | 0.198 |
| U2 | Input Open from U1 | U2 goes OFF immediately after turning ON; duty cycle has large change; T1 voltage drops; output FETs turn OFF | S1 | D | 0.18 | 1.1 | 0.198 |
| U2 | Output Open | No drive current for Q2, Q3 and Q5; T1 voltage drops; oscillation stops | S1 | D | 0.36 | 1.1 | 0.396 |
| U2 | Supply Open | No drive current for Q2, Q3 and Q5; T1 voltage drops; oscillation stops | S1 | D | 0.12 | 1.1 | 0.132 |
| U2 | Output Stuck Low | Oscillation stops; T1 voltage drops; output FETs turn OFF | S1 | D | 0.08 | 1.1 | 0.088 |
| U2 | Output Stuck High | Q3 and Q5 stay ON; power supply is shorted through R12 when Q4 and Q6 turn ON; fuse blows | S1 | D | 0.08 | 1.1 | 0.088 |
| VR1 | No output | Loss of power to device; output FETs turn OFF | S1 | D | 0.52 | 3.9 | 2.028 |
| VR1 | Incorrect Output | Not sensitive to lower voltage to a point; eventually T1 output voltage drops below D6 cutoff for outputs | S2 | U | 0.48 | 3.9 | 1.872 |

TABLE 2

Summary of Fail Safe Modes

| | SAFE | DET | FIT | PCT |
|---|---|---|---|---|
| Total failure rate: | | | 372.42 | |
| Conditional failure rates: | = S1 | | 189.53 | 50.9% |
| | = S2 | | 130.23 | 35.0% |
| | = S3 | | 6.976 | 1.9% |
| | = D | | 45.67 | 12.3% |
| | | = D | 235.31 | 63.2% |
| | | = U | 137.10 | 36.8% |
| | = D | = D | 44.48 | 11.9% |

While specific embodiments of the invention have been described in detail, it will be appreciated by those skilled in the art that various modifications and alternatives to those details could be developed in light of the overall teachings of the disclosure. Accordingly, the particular embodiments disclosed are meant to be illustrative only and not limiting as to the scope of the invention which is to be given the full breadth of the appended claims and any and all equivalents thereof.

What is claimed is:

1. A nuclear reactor system having a pressurized coolant circuit including a pressure vessel, heat exchanger, core makeup tank and connecting piping, the connecting piping including a main coolant piping loop connecting the heat exchanger to the pressure vessel in a closed loop configuration and a makeup water connection connecting the core makeup tank to the pressure vessel, the nuclear reactor system being housed within a containment shell and further comprising;

an in-containment water reservoir that is maintained vented to an atmosphere of the containment shell;

a depressurization system for automatically depressurizing the pressurized coolant circuit in the event of a design basis accident and connecting the water reservoir to the pressure vessel; and a blocking device is connected to the depressurization system for preventing the depressurization system from activating when coolant within the core makeup tank is above a preselected level.

2. The nuclear reactor system of claim 1 wherein the blocking device fails in a failsafe condition wherein the failure of substantially any component within the blocking device will stop the blocking device from preventing the depressurization system from activating.

3. The nuclear reactor system of claim 1 wherein the preselected level is a level at which the core makeup tank is considered substantially full.

4. The nuclear reactor system of claim 1 wherein the core makeup tank comprises at least two water tanks connected to the pressure vessel and wherein the blocking device prevents the depressurization system from activating when coolant within each of the water tanks is above the preselected level.

5. The nuclear reactor system of claim 4 wherein the blocking device does not prevent the depressurization system from activating when coolant within any of the water tanks is below the preselected level.

6. The nuclear reactor system of claim 4 wherein the blocking device does not prevent the depressurization system from activating when disabled by a remote manual override switch or other interlocking condition.

7. The nuclear reactor system of claim 1 wherein the blocking device is connected to a priority command input of a component interface module controlling a valve of the depressurization system.

* * * * *